(12) United States Patent
Whatmore et al.

(10) Patent No.: US 7,046,103 B2
(45) Date of Patent: May 16, 2006

(54) ELECTRIC FILTER COMPRISING A PLURALITY OF THIN FILM BULK ACOUSTIC RESONATORS

(75) Inventors: Roger W. Whatmore, Milton Keynes (GB); Paul B. Kirby, Northampton (GB); Qingxin Su, Xi'an (CN); Eiju Komuro, Funabashi (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/031,239

(22) PCT Filed: May 23, 2001

(86) PCT No.: PCT/GB01/02293

§ 371 (c)(1),
(2), (4) Date: Apr. 2, 2002

(87) PCT Pub. No.: WO01/91290

PCT Pub. Date: Nov. 29, 2001

(65) Prior Publication Data

US 2002/0118078 A1    Aug. 29, 2002

(30) Foreign Application Priority Data

May 24, 2000    (GB) ................................. 0012437.0

(51) Int. Cl.
*H01P 3/08* (2006.01)
(52) U.S. Cl. ...................... 333/204; 333/219
(58) Field of Classification Search .............. 333/189, 333/193, 196, 204, 219; 310/313 C, 313 B, 310/313 R
See application file for complete search history.

(56) References Cited

U.S. PATENT DOCUMENTS

| 4,320,365 A | | 3/1982 | Black et al. ................. 333/187 |
| 4,398,162 A | * | 8/1983 | Nagai .......................... 333/189 |
| 4,818,959 A | * | 4/1989 | Katoh ....................... 333/28 R |
| 5,077,544 A | * | 12/1991 | Ogawa et al. .............. 333/189 |
| 5,185,589 A | * | 2/1993 | Krishnaswamy et al. ... 333/133 |
| 5,587,620 A | | 12/1996 | Ruby et al. ................. 310/346 |
| 5,770,988 A | * | 6/1998 | Goto et al. .................. 333/236 |
| 5,873,153 A | | 2/1999 | Ruby et al. ................. 29/25.35 |
| 5,920,243 A | * | 7/1999 | Ishikawa et al. ............ 333/204 |
| 5,939,957 A | | 8/1999 | Iwata .......................... 333/189 |
| 5,999,069 A | * | 12/1999 | Ushiroku .................... 333/193 |
| 6,208,224 B1 | * | 3/2001 | Tanuguchi et al. .......... 333/193 |
| 6,369,672 B1 | * | 4/2002 | Ikada .......................... 333/193 |
| 6,377,136 B1 | * | 4/2002 | Rittenhouse et al. ....... 333/188 |
| 6,462,631 B1 | * | 10/2002 | Bradley et al. ............. 333/189 |
| 6,531,934 B1 | * | 3/2003 | Mikami et al. ............. 333/134 |
| 6,549,100 B1 | * | 4/2003 | Taniguchi ................... 333/193 |

FOREIGN PATENT DOCUMENTS

| EP | 0 771 070 A2 | 5/1997 |
| EP | 0 880 227 A2 | 11/1998 |
| GB | 2 208 341 A | 3/1989 |
| GB | 2 208 459 A | 3/1989 |
| GB | 2 286 304 A | 8/1995 |
| WO | WO 98/15984 | 4/1998 |

* cited by examiner

*Primary Examiner*—Kenneth B. Wells
(74) *Attorney, Agent, or Firm*—Oliff & Berridge, PLC

(57) ABSTRACT

An electric filter comprises a plurality of thin film bulk acoustic resonants (10, 11) arranged in series and in parallel which have electrodes (24, 25) of different working area (L) and optionally a piezoelectric layer (23) of different thickness (T).

15 Claims, 9 Drawing Sheets

(Exemplary Art)

ELECTRIC FILTER COMPRISING A PLURALITY OF THIN FILM BULK ACOUSTIC RESONATORS

The present invention relates to a filter comprising plural thin film bulk acoustic resonators (FBARs) and more particularly, is directed to a piezoelectric filter which is manufactured using thin film technology in order to obtain a low close-in rejection and a low out-of-band rejection at high frequency.

Thin film bulk acoustic resonators (FBARs) are attractive devices since they show resonant peaks at high frequency, particularly in the MHz and GHz regions. Moreover, FBARs can be achieved in a small device size (~mm). Thus they are considered to be useful not only as resonators, but to be applied for filters, transducers, etc., which would be installed in small, light, thin electric appliance products, such as a mobile phone.

It is known that an electric filter can be made with plural FBARs. That kind of filter can work in MHz frequency region or in GHz frequency region. Generally speaking, for a band-pass filter, the rejection level compared to signal-pass area improves when more FBARs are used for the filter.

FIG. 9 shows one example of a filter comprising four FBARs. The four FBARs are separated into 2 groups according to their functions in the filter. FBAR1 and FBAR2 in FIG. 9 are connected in series. Therefore they are in one group. Also, FBAR3 and FBAR4 are connected in parallel and in the other group. Usually those FBARs are prepared on one substrate and prepared under the same procedure. Therefore each FBAR consists of exactly the same structure. In other words, the same thickness and the same materials for all layers on each FBAR. And also, usually each FBAR has the same working area size.

It is important to prepare a band-pass filter at high frequency in the MHz or GHz region because those frequency regions are often used for wireless communications these days. For a band-pass filter, it is extremely important that both the close-in rejection and the out-of-band rejection are low. Therefore, a technique has been demanded to make a filter with a good close-in and out-of-band rejection.

An object of the present invention is to prepare a filter, showing a low close-in rejection and a low out-of-band rejection which comprises plural FBARs. By this invention, these properties can be obtained by changing the sizes of the working areas between FBARs in series and in parallel.

The filter comprises a plurality of FBARs in which at least one FBAR is in series and one FBAR in parallel.

Each FBAR comprises a plurality of layers consisting of (from lower to upper): a substrate, a dielectric layer, one or more metal layers acting as a lower electrode, a piezoelectric layer, one or more metal layers acting as an upper electrode.

An FBAR exhibits a series resonance and a parallel resonance at respective frequencies that are functions of the thicknesses of all of the layers. In such a filter, it is useful to alter the sizes of the working areas between the FBARs in series and the FBARs in parallel.

The working area is usually restricted with the area sizes of electrodes in contact with the piezoelectric layer to form the FBARs. In this case, the resonant peaks are exhibited as different shapes of the reactance curves for FBARs in series relative to FBAR's in parallel.

As a result of making a filter using FBARs in series and in parallel with different working areas, a filter which shows a low close-in rejection and a low out-of-band rejection can be obtained.

The theory is described using FIG. 9. In FIG. 9, if all FBARs are prepared under the same condition, both FBARs in series (FBARs 1 and 2) and FBARs in parallel (FBARs 3 and 4) exhibit exactly the same resonant peaks. Then, if the thickness of the piezoelectric layer is changed for FBARs in series relative to FBARs in parallel, the resonant peaks appear at a different frequency but the shape of the resonant peaks is the same, as shown in FIG. 10(a). As a result of making a filter using those FBARs which comprise a different thickness of the piezoelectric layer for FBARs in series relative to FBARs in parallel, a through signal ($S_{21}$) of the filter is obtained, as shown in FIG. 10(b). In FIG. 10(b), close-in rejections appear at frequencies of $f_{s2}$ and $f_{p1}$ and an out-of-band rejection is at a frequency region below $f_{s2}$ and above $f_{p1}$.

On the other hand, if in FIG. 9, it is assumed that the size of the top electrode and bottom electrode on FBARs in series (FBARs 1 and 2) and on FBARs in parallel (FBARs 3 and 4) are different but the other dimensions on all FBARs are supposed to be the same as the filter in FIG. 10, then FBARs in series and FBARs in parallel show different shapes of reactance curves, as shown in FIG. 11(a). In FIG. 11(a), the shapes of the curves are different because of the differences between the capacitances of the working areas. As a result of preparing a filter using those different FBARs in series and in parallel, a filter which shows a low close-in rejection, particularly at $f_{s2}$, and a low out-of-band rejection can be obtained, as shown in FIG. 11(b).

In order to alter the sizes of electrodes, one example would be to change the mask designs for the electrodes for the FBARs in series relative to the FBARs in parallel.

The invention will now be described in more detail, by way of example only, with reference to the accompanying drawings, wherein.

According to a preferred embodiment of the invention, the filter is prepared with FBARs in series and in parallel which have different sizes of electrodes and different thicknesses of piezoelectric layer. The embodiment may be understood in view of FIGS. 1 and 2, which illustrate respectively a schematic diagram of the filter and a cross-section of each FBAR in the filter.

Figure 1:
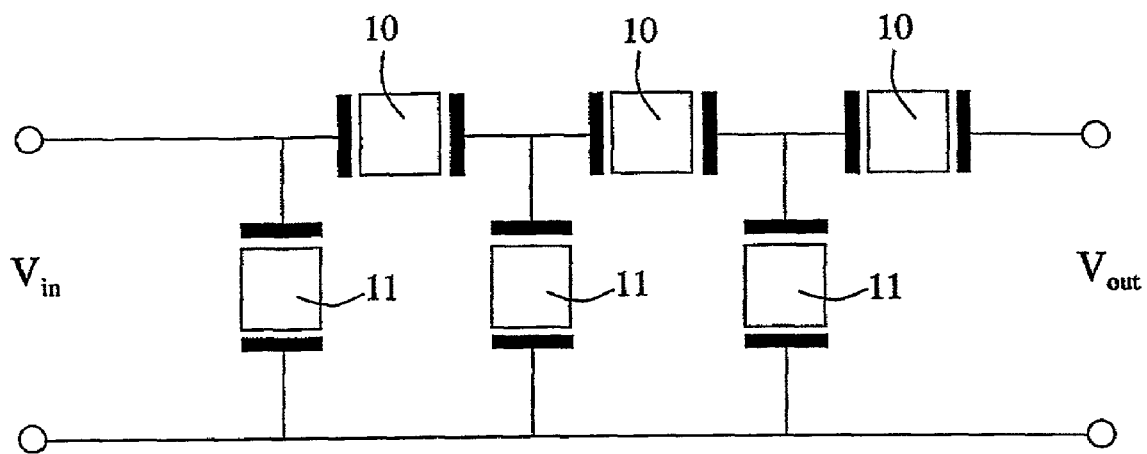
FIG. 1 illustrates a schematic diagram of a preferred filter which comprises three FBARs in series and three FBARs in parallel.
Figure 2:
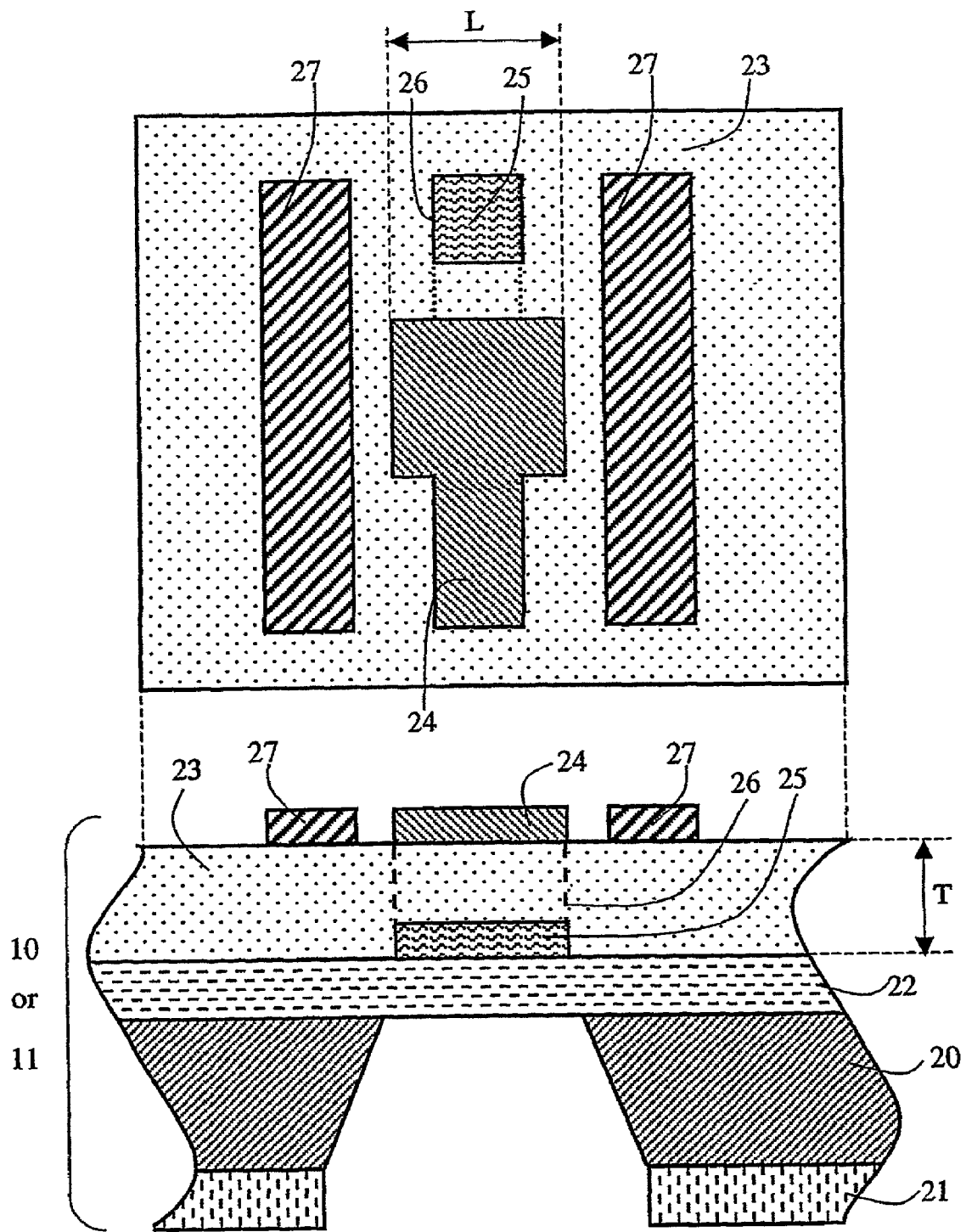
FIG. 2 illustrates a top view and a cross section view of a FBAR.

The three FBARs in series (10) are indicated in FIG. 1 as are the three FBARs in parallel (11). Those six FBARs are prepared on one substrate. The FBARs in series 10 and in parallel 11 have the structure shown in FIG. 2. The FBARs in series 10 and in parallel 11 comprise a top electrode 24, a bottom electrode 25, a piezoelectric layer 23 and a bridge or membrane layer 22 on a Si wafer 20 which is etched anisotropically using a backside pattern layer 21. There are two points of difference between the FBARs in series 10 and in parallel 11. One is the thickness of the piezoelectric layer 23 (shown as T in FIG. 2), and the other is the size of the top electrode 24 and the bottom electrode 25 (shown as L in FIG. 2).

The preparation procedure of the filter, comprising six FBARs, is described as follows. At first, silicon nitride ($SiN_x$) is coated at 200 nm with chemical vapour deposition on both sides of a bare Si wafer 20. The $SiN_x$ on the front side of the Si wafer 20 is a membrane layer 22. A backside pattern layer 21 is prepared on the back side of the Si wafer 20 in the $SiN_x$ with photolithography and reactive ion etching. A bottom electrode 25 is prepared with so-called a lift-off process which is carried out as follows. First a pattern of photoresist is prepared with photolithography. Then, chromium and gold (Cr/Au) are deposited by sputtering at thicknesses of 10 nm and 100 nm respectively. Cr is used as an adhesion layer. Next, the patterned photoresist and Cr/Au on it is removed with acetone, because the photoresist dissolves in acetone. After that procedure, a bottom electrode 25 is obtained. Next, Zinc Oxide (ZnO) is deposited for a piezoelectric layer 23 by sputtering. The thickness of the piezoelectric layer 23 is 1.2 microns for FBARs in series 10 and 1.255 microns for FBARs in parallel 11, respectively. In order to obtain a piezoelectric layer 23 which shows a different thickness, a photolithography and an etching are employed. The piezoelectric layer 23 is etched with acetic acid to make a contact hole 26 in order to touch a bottom electrode 25 with an electrical probe. Afterwards, a top electrode 24 is prepared by the lift-off process. The Cr and Au thickness of a top electrode 24 is set at 10 nm and 100 nm respectively. The top electrode 24 has a transmission line and a square working area on which one dimension shown as L in FIG. 2. The working area size is the same for the bottom electrode 25. When the top electrode 24 is prepared, two ground electrodes 27 are prepared as well under the same lift-off process, so the top electrode 24 has a coplanar wave-guide structure for which the characteristic impedance is set at about 50 ohms.

The size of the working area, which is equal to the centre part of the top electrode 24 and bottom electrode 25, is 110 microns square for FBARs in series 10 and 285 microns square for FBARs in parallel 11. The mask design for both electrodes is changed between FBARs in series 10 and FBARs in parallel 11.

Finally, the Si wafer 20 is etched from its backside with KOH solution, using the backside pattern layer 21 and the preparation process for the filter is finished.

A network analyser is used for the electrical measurement. At first, a measurement is carried out on each FBAR in the filter. Each FBAR, which is not connected to other FBARs, is prepared individually in order to measure the electrical response separately.

Figure 3:
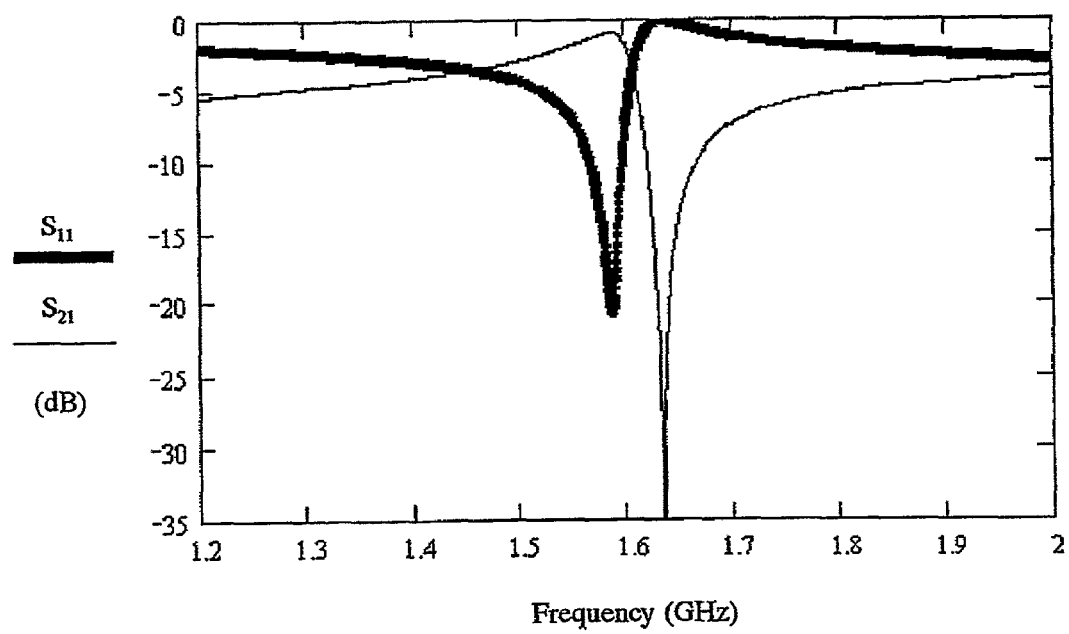
FIG. 3 illustrates the S parameters of a FBAR which comprises electrodes whose size is 110 microns square and a piezoelectric layer whose thickness is 1.2 microns, and which is used as FBARs in series on a preferred filter.

FIG. 3 shows the S parameters of an FBAR in series 10, which comprises a piezoelectric layer 23 at 1.2 microns thick and a working area at L=110 microns. $S_{11}$ is the reflection coefficient at the RF power source and $S_{21}$ is the transmission coefficient measured at the output port. Series and parallel resonant peaks on $S_{11}$ and $S_{21}$ are presented at the frequency of 1.585 GHz and 1.636 GHz, respectively.

Figure 4:
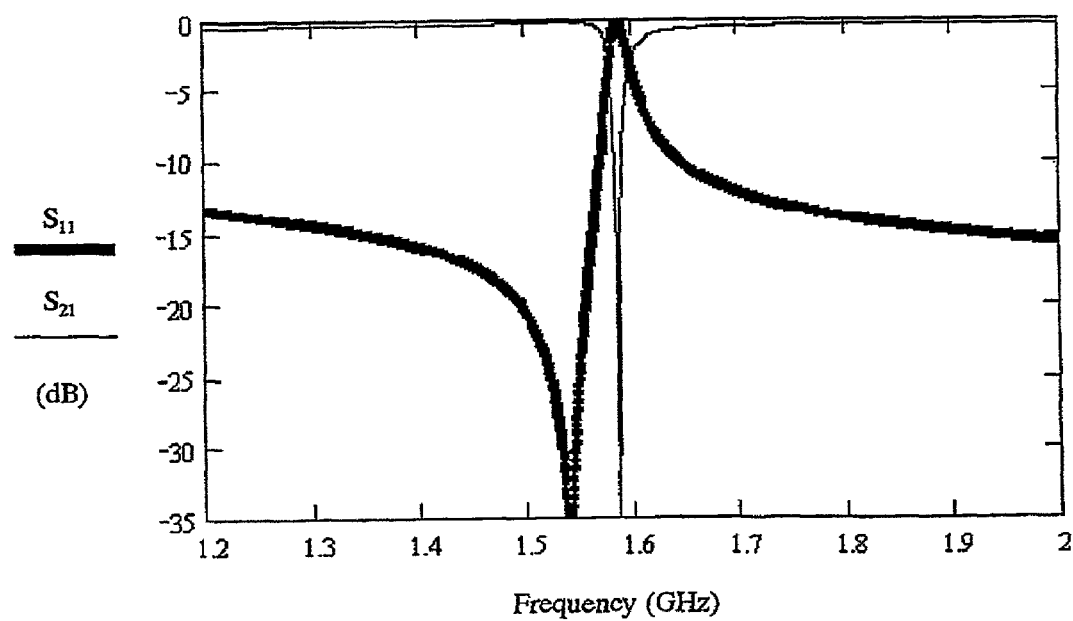
FIG. 4 illustrates S parameters of a FBAR which comprises electrodes whose size is 285 microns square and a piezoelectric layer whose thickness is 1.255 microns, and which is used as FBARs in parallel on a preferred filter.

On the other hand, FIG. 4 shows the S parameters of a FBAR in parallel 11, which comprises a piezoelectric layer 23 at 1.255 microns thick and a working area at L=285 microns. All the resonant peaks in $S_{11}$ and $S_{21}$ are shifted to a lower frequency relative to the same kind of peaks in FIG. 3. The series resonant peak on $S_{11}$ in FIG. 4 appears at 1.543 GHz and the parallel resonant peak on $S_{11}$ in FIG. 4 and a resonant peak on $S_{21}$ in FIG. 4 are presented at 1.585 GHz which is the same frequency as for the series resonant peak in FIG. 3. Also, the shapes of $S_{11}$ and $S_{21}$ in FIG. 4 are different from those in FIG. 3 due to the difference of the capacitance of a working area of FBARs.

Figure 5:
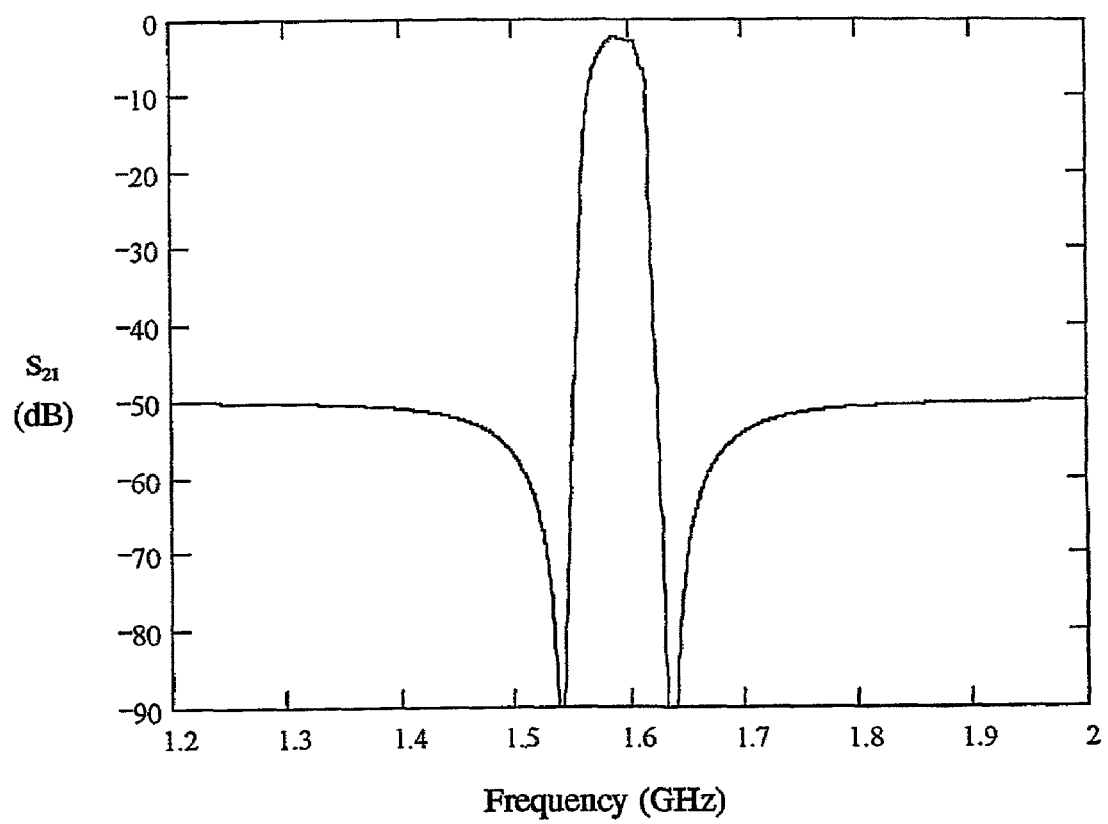
FIG. 5 illustrates a $S_{21}$ curve of a preferred filter which comprises three similar FBARs in series, comprising electrodes whose size is 110 microns square and a piezoelectric layer whose thickness is 1.2 microns, and which comprises three similar FBARs in parallel, comprising electrodes whose size is 285 microns square and a piezoelectric layer whose thickness is 1.255 microns.

Using those two kinds of FBARs, the filter is fabricated using the configuration in FIG. 1. The through coefficient ($S_{21}$) of the filter is shown in FIG. 5. Close-in rejections of the filter appear at 1.540 GHz and at 1.635 GHz. One close-in rejection at 1.540 GHz is due to a series resonant peak of $S_{11}$ on FBARs in parallel 11 at 1.543 GHz in FIG. 4. The other close-in rejection at 1.635 GHz is due to a parallel resonant peak of $S_{21}$ on FBARs in series 10 at 1.636 GHz in FIG. 3. An out-of-band rejection in a frequency region below 1.540 Ghz and above 1.635 GHz is less than −50 dB.

To compare with the preferred filter above, a filter fabricated using the same configuration in FIG. 1 is made. On the compared filter, FBARs for both FBARs in series 10 and FBARs in parallel 11 comprise a working area at L=110 microns. The thickness of the piezoelectric layer 23 is 1.2 microns for FBARs in series 10 and 1.255 microns for the FBARs in parallel 11.

At first, a measurement is carried out on each FBAR in the compared filter. Each FBAR, which is not connected to the other FBARs, is prepared individually in order to measure the electrical response separately.

Figure 6:
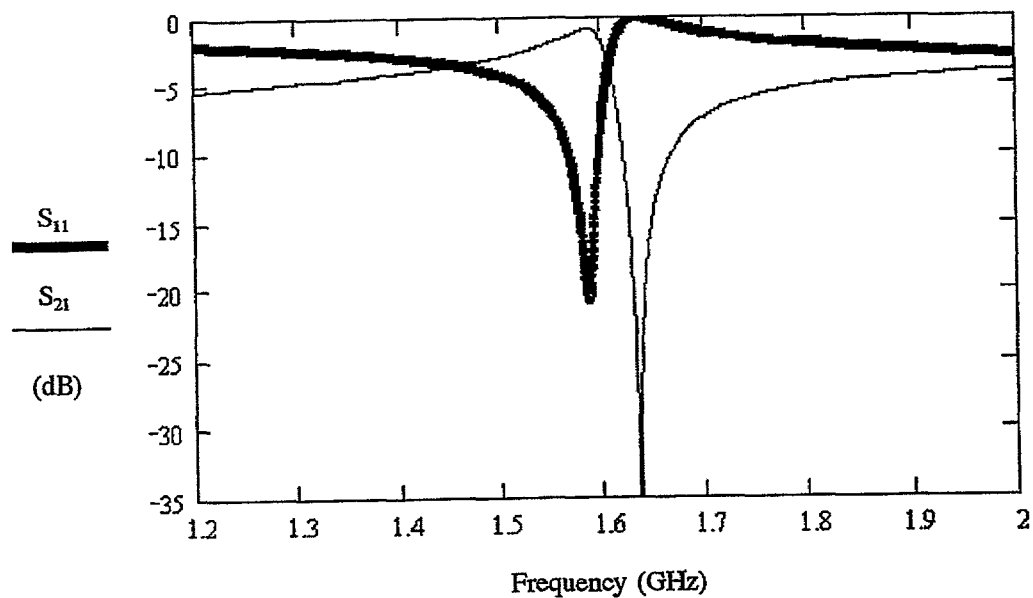
FIG. 6 illustrates the S parameters of a FBAR which comprises electrodes whose size is 110 microns square and a piezoelectric layer whose thickness is 1.2 microns, and which is used as FBARs in series on a compared filter.

FIG. 6 shows S parameters of an FBAR in series 10, which comprises a piezoelectric layer 23 at 1.2 microns thick and a working area at L=110 microns. Since the FBAR in series 10 in the compared filter is the same as a FBAR in series 10 in the preferred filter, the S parameters in FIG. 6 are the same as those in FIG. 3.

Figure 7:
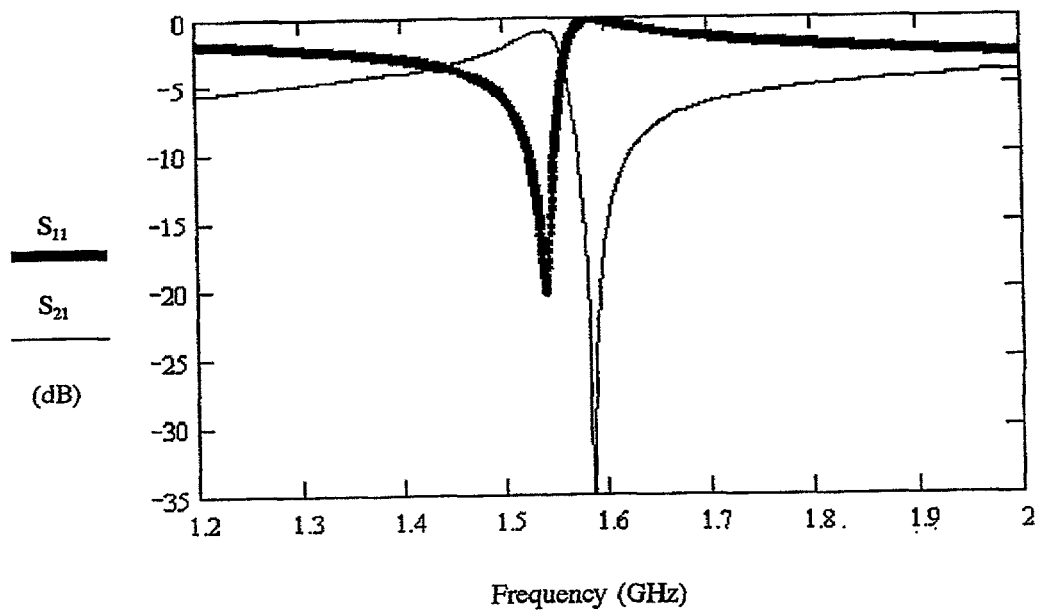
FIG. 7 illustrates S parameters of a FBAR which comprises electrodes whose size is 110 microns square and a piezoelectric layer whose thickness is 1.255 microns, and which is used as FBARs in parallel on a compared filter.

On the other hand, FIG. 7 shows the S parameters of an FBAR in parallel 11 in the compared filter, which comprises a piezoelectric layer 23 at 1.255 microns thick and a working area at L=110 microns. All resonant peaks on $S_{11}$ and $S_{21}$ in FIG. 7 are shifted to lower frequency than the same kind of peaks in FIG. 6. The series resonant peaks on $S_{11}$ and $S_{21}$ in FIG. 7 appear at 1.543 GHz. The parallel resonant peaks on $S_{11}$ and $S_{21}$ are presented at 1.585 GHz which is the same frequency as for the series resonant peak in FIG. 6. However, the shapes of $S_{11}$ and $S_{21}$ in FIG. 7 are the same as those in FIG. 6 because the working area is the same for both FBARs in series 10 and FBARs in parallel 11.

Figure 8:
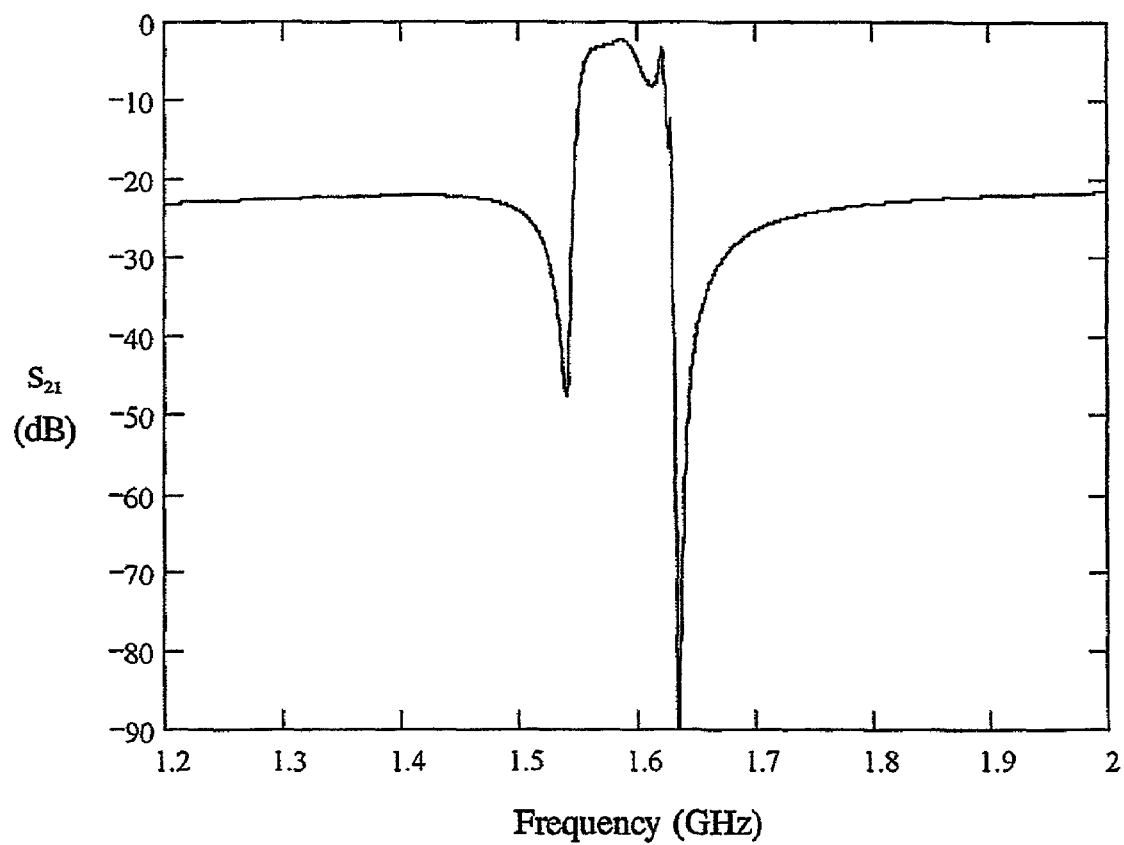
FIG. 8 illustrates a $S_{21}$ curve of a compared filter which comprises three similar FBARs in series, comprising electrodes whose size is 110 microns square and a piezoelectric layer whose thickness is 1.2 microns, and which comprises three same FBARs in parallel, comprising electrodes whose size is 110 microns square and a piezoelectric layer whose thickness is 1.255 microns.
Figure 9:
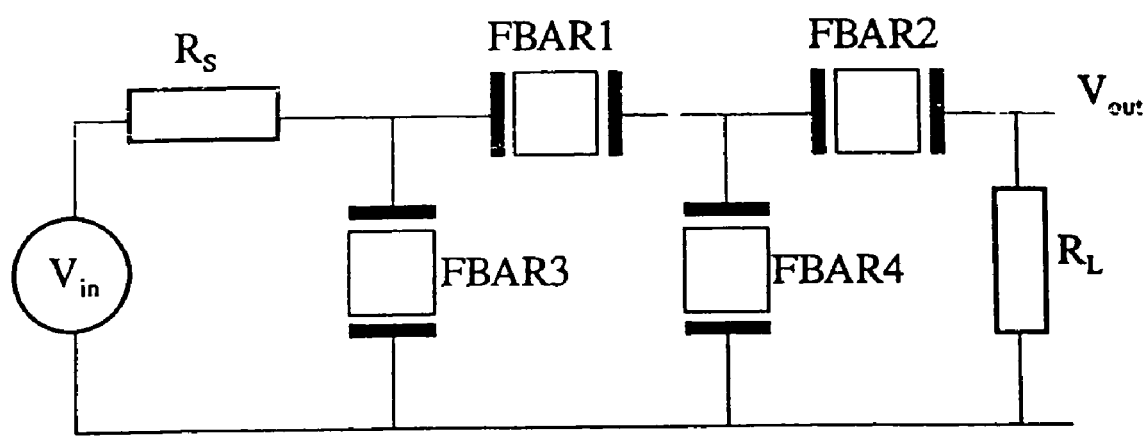
FIG. 9 illustrates a schematic diagram of electrical equivalent circuit for a filter which comprises two FBARs in series and two FBARs in parallel.
Figure 10:
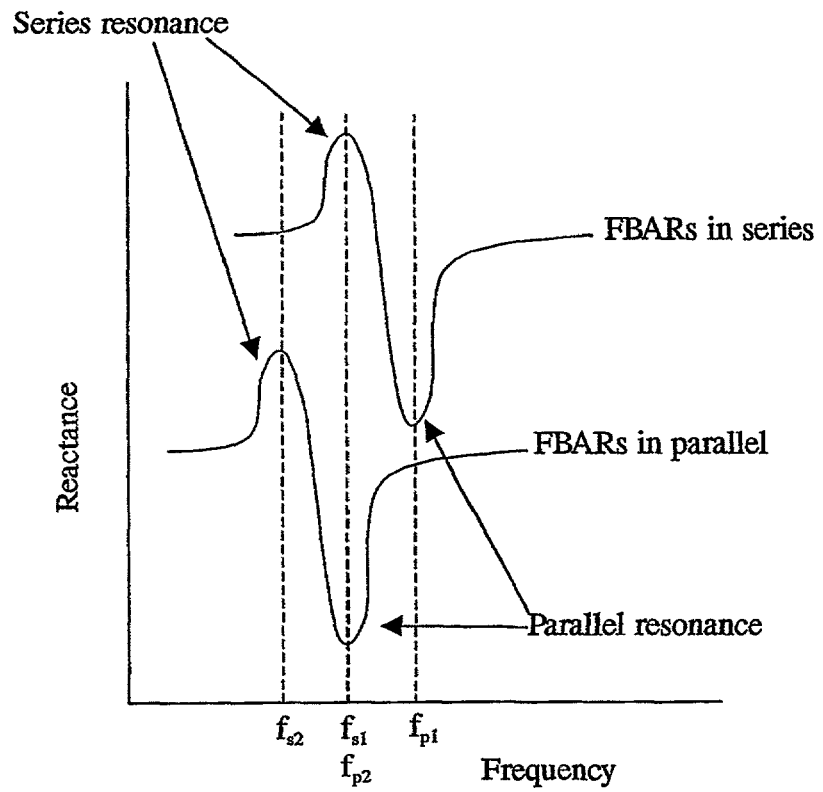
FIG. 10(a) illustrates the resonant curves of FBARs which comprises different thickness of a piezoelectric layer for FBARs in series relative to FBARs in parallel.
FIG. 10(b) illustrates a $S_{21}$ curve of a filter which comprises two types of FBARs, comprising different thickness of a piezoelectric layer, for two FBARs in series relative to two FBARs in parallel.
Figure 10:
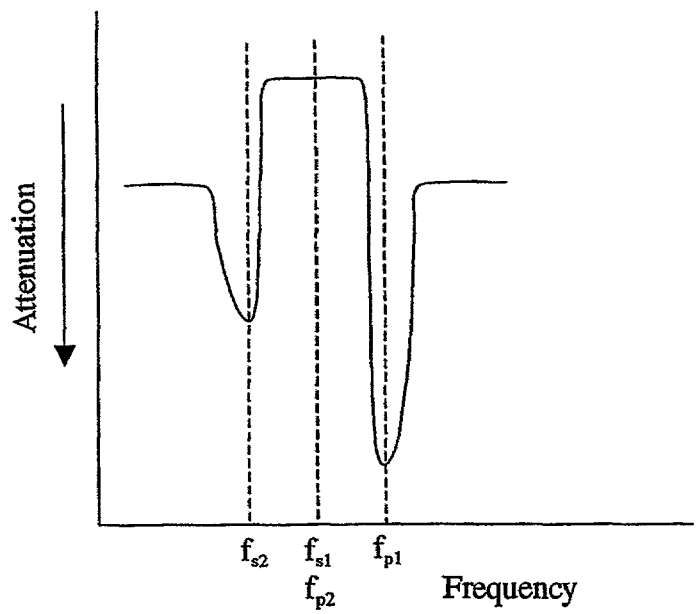
Figure 11:
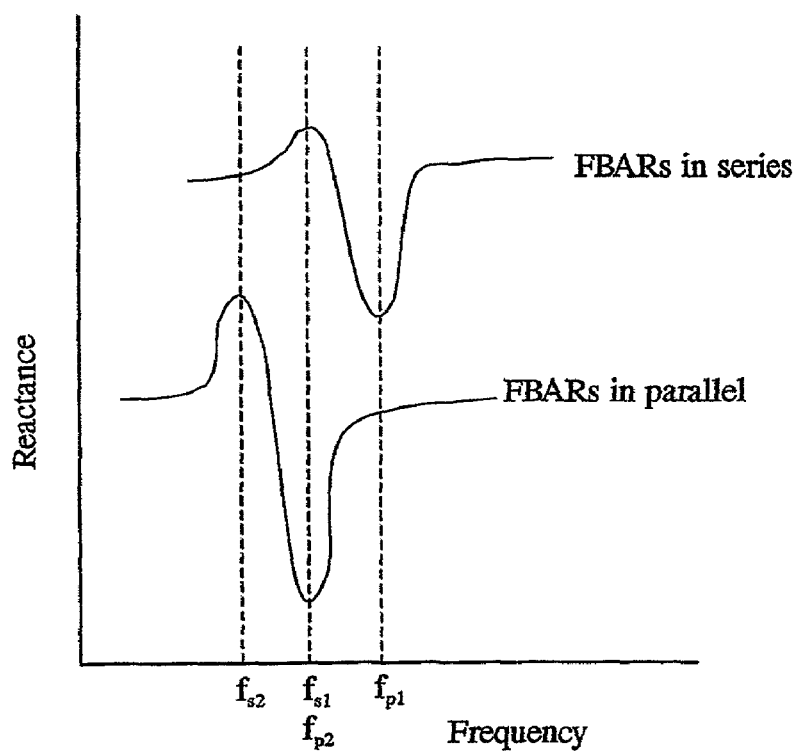
FIG. 11(a) illustrates the resonant curves of FBARs which comprises different thickness of a piezoelectric layer and different size of electrodes for FBARs in series relative to FBARs in parallel.
FIG. 11(b) illustrates a $S_{21}$ curve of a filter which comprises two types of FBARs, comprising different thickness of a piezoelectric layer and different size of electrodes, for two FBARs in series relative to two FBARs in parallel.
Figure 11:
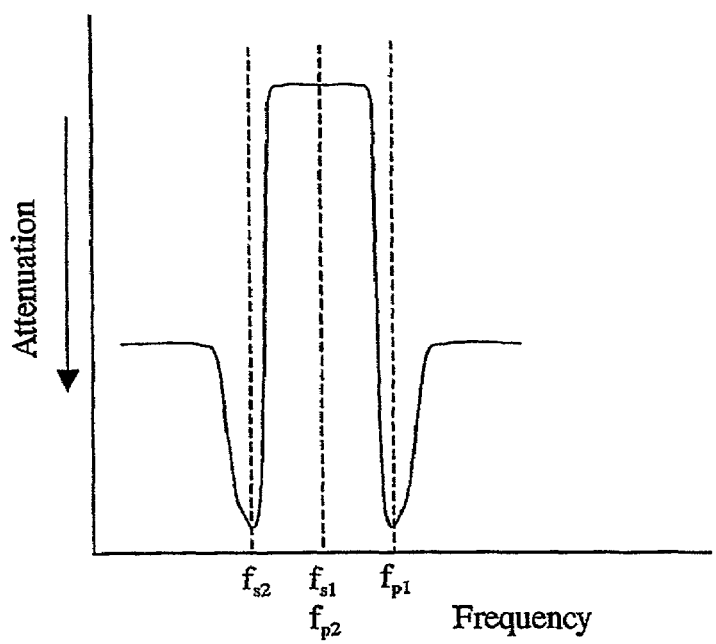

Using those two kinds of FBARs, the compared filter is fabricated using the configuration in FIG. 1. The through coefficient ($S_{21}$) of the compared filter is shown in FIG. 8. Close-in rejections of the compared filter appear at 1.540 GHz and at 1.635 GHz. Those frequencies are the same as in FIG. 5. Comparing the peak depth of one close-in rejection at 1.540 GHz, a close-in rejection in FIG. 5 is deeper than that in FIG. 7. Moreover, comparing an out-of-band rejection, the preferred filter shows less out-of-band rejection than the compared filter on which an out-of-band rejection is around −22 dB in FIG. 8. The superior performance of the preferred filter is obtained because of a different shape of S parameters between FBARs in series 10 and FBARs in parallel 11. The different shapes of the S parameters are due to the difference in the capacitances of the FBAR's due to their different working areas.

Comparing the preferred filter with the compared filter, the preferred filter shows a lower close-in rejection and a lower out-of-band response.

The preferred filter described above is one example for this invention. However, the thin film techniques and materials for each layer on the preferred filter described above are not restricted to those described. For example, the material for the piezoelectric layer 23 is not restricted to ZnO. Aluminium nitride (AlN) which shows a high Q value and lead titanate zirconate (PZT) which shows a large electro-mechanical coefficient are also usable. Also, lead scandium tantalum oxide and bismuth sodium titanium oxide are other examples of piezoelectric materials. The material for the top electrode 24 and a bottom electrode 25 is not restricted with Cr/Au. Aluminium (Al) and platinum (Pt), which are often used for electrodes, are also usable. The material for the membrane layer 22 and a backside pattern layer 21 is not restricted to $SiN_x$. $SiO_2$ is also possible.

The numbers of FBARs in series 10 and FBARs in parallel 11 are not restricted to 3 each. The numbers of FEBARs in series 10 and FBARs in parallel 11 should be decided by the specifications for the level of close-in rejection, area size for the filter and so on.

The FBARs which are used as FBARs in series 10 and FBARs in parallel 11, are not restricted to an FBAR which comprises an etched hole on Si wafer 20 at the backside of a bottom electrode 25. Any air gap or a Bragg reflector may be used at the backside of the bottom electrode 25. Therefore Si wafer 20 is not necessarily used as a substrate for the FBARs.

It is sometimes usual to make electrodes larger than the working area to make a contact area of measurement probes, for instance. In this case, the working area is restricted with the area size of electrodes in contact with the piezoelectric layer 23 to form resonators where resonance occurs.

The invention claimed is:

1. An electric filter comprising a plurality of thin film bulk acoustic resonators (FBARs) each comprising a thin layer of piezoelectric material sandwiched between a top electrode and a bottom electrode, the plurality of FBARs being linked in a series/parallel connection arrangement for which the areas of the electrodes in contact with the piezoelectric layer to form the resonators are different between in series and in parallel FBARs, wherein:
   all the FBARs are disposed on one substrate;
   the piezoelectric layer has a flat top surface; and
   the top electrode has a coplanar wave-guide structure by being disposed on the top surface of the piezoelectric layer together with two ground electrodes.

2. An electric filter as described in claim 1, wherein the thickness of the piezoelectric material is different between the in series and in parallel FBARs.

3. An electric filter as described in claim 1, wherein the areas of the electrodes for the FBARs linked in series are adjusted so that their series resonance frequency is the same as the parallel resonance frequency of the FBARs linked in parallel.

4. An electric filter as described in claim 1, wherein the piezoelectric material is zinc oxide.

5. An electric filter as described in claim 1, wherein the piezoelectric material is substantially comprised of lead titanate zirconate.

6. An electric filter as described in claim 1, wherein the piezoelectric material is aluminum nitride.

7. An electric filter as described in claim 1, wherein the piezoelectric material is substantially comprised of lead scandium tantalum oxide.

8. An electric filter as described in claim 1, wherein the piezoelectric material is substantially comprised of bismuth sodium titanium oxide.

9. An electric filter as described in claim 1, wherein the electrodes comprise gold.

10. An electric filter as described in claim 1, wherein the electrodes comprise aluminum.

11. An electric filter as described in claim 1, wherein the electrodes comprise platinum.

12. An electric filter as described in claim 1, wherein two FBARs are linked in series and two FBARs are linked in parallel.

13. An electric filter as described in claim 1, wherein three FBARs are linked in series and three FBARs are linked in parallel.

14. An electric filter according to claim 1, wherein the piezoelectric material of FBARs in parallel is thicker than that of FBARs in series.

15. An electric filter according to claim 1, wherein the area of electrodes of FBARs in parallel is greater than that of FBARs in series.

* * * * *